(12) United States Patent
Yokota et al.

(10) Patent No.: US 7,830,001 B2
(45) Date of Patent: Nov. 9, 2010

(54) CU-MO SUBSTRATE AND METHOD FOR PRODUCING SAME

(75) Inventors: Masayuki Yokota, Suita (JP); Kazuhiro Shiomi, Suita (JP); Fumiaki Kikui, Suita (JP); Masaaki Ishio, Suita (JP)

(73) Assignee: Neomax Materials Co., Ltd., Osaka (JP)

( * ) Notice: Subject to any disclaimer, the term of this patent is extended or adjusted under 35 U.S.C. 154(b) by 433 days.

(21) Appl. No.: 11/915,201

(22) PCT Filed: May 23, 2006

(86) PCT No.: PCT/JP2006/310223

§ 371 (c)(1),
(2), (4) Date: Feb. 13, 2008

(87) PCT Pub. No.: WO2006/126525

PCT Pub. Date: Nov. 30, 2006

(65) Prior Publication Data

US 2009/0045506 A1    Feb. 19, 2009

(30) Foreign Application Priority Data

May 23, 2005    (JP) .............................. 2005-149232

(51) Int. Cl.
*H01L 21/00* (2006.01)
(52) U.S. Cl. .................. 257/712; 257/746; 257/762; 257/763; 257/771; 257/E21.159; 257/E23.009; 257/E23.101; 257/E23.112; 257/E29.089; 257/E29.106; 438/30; 438/610; 438/648
(58) Field of Classification Search ......... 257/712–771, 257/E21.159, E23.009, 101, 112, E29.089, 257/106; 438/30, 610, 648
See application file for complete search history.

(56) References Cited

U.S. PATENT DOCUMENTS 4,830,820 A * 5/1989 Itoh et al. ................. 419/23
6,183,874 B1 * 2/2001 Yamagata et al. ........... 428/472

(Continued)

FOREIGN PATENT DOCUMENTS

GB    2138633 A    10/1984

(Continued)

OTHER PUBLICATIONS

PCT International Preliminary Report on Patentability dated Nov. 23, 2007 for International Application No. PCT/JP2006/310223 filed May 23, 2006.

*Primary Examiner*—Michael S Lebentritt
(74) *Attorney, Agent, or Firm*—Nixon Peabody LLP; Marc W. Butler

(57) ABSTRACT

A Cu—Mo substrate 10 according to the present invention includes: a Cu base 1 containing Cu as a main component; an Mo base having opposing first and second principal faces 2a, 2b and containing Mo as a main component, the second principal face 2b of the Mo base 2 being positioned on at least a portion of a principal face 1a of the Cu base 1; and a first Sn—Cu-type alloy layer 3 covering the first principal face 2a and side faces 2c and 2d of the Mo base 2, the first Sn—Cu-type alloy layer 3 containing no less than 1 mass % and no more than 13 mass % of Sn.

11 Claims, 5 Drawing Sheets

U.S. PATENT DOCUMENTS

| | | | |
|---|---|---|---|
| 6,388,273 B1 * | 5/2002 | Yamagata et al. | 257/77 |
| 6,693,353 B1 * | 2/2004 | Hirayama et al. | 257/746 |
| 7,718,832 B1 * | 5/2010 | Hurley et al. | 568/869 |
| 2002/0191377 A1 | 12/2002 | Osada et al. | |
| 2006/0244125 A1 | 11/2006 | Shiomi et al. | |
| 2009/0045506 A1 * | 2/2009 | Yokota et al. | 257/712 |
| 2009/0227053 A1 * | 9/2009 | Kwon et al. | 438/30 |
| 2009/0278233 A1 * | 11/2009 | Pinnington et al. | 257/615 |
| 2010/0096650 A1 * | 4/2010 | Ubahara | 257/94 |

FOREIGN PATENT DOCUMENTS

| | | |
|---|---|---|
| JP | 61-042475 | 2/1986 |
| JP | 62-183132 | 8/1987 |
| JP | 02-281642 | 11/1990 |
| JP | 06-268115 | 9/1994 |
| JP | 06-344131 | 12/1994 |
| JP | 11-284111 | 10/1999 |
| JP | 2000-269392 | 9/2000 |
| JP | 2001-358266 | 12/2001 |

* cited by examiner

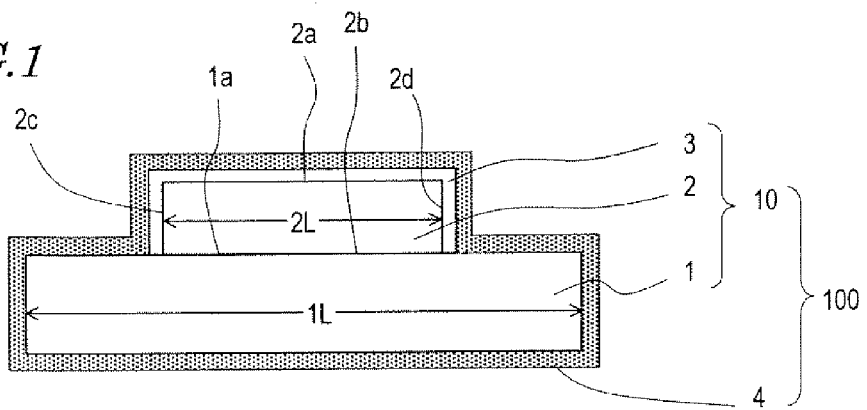
FIG.1
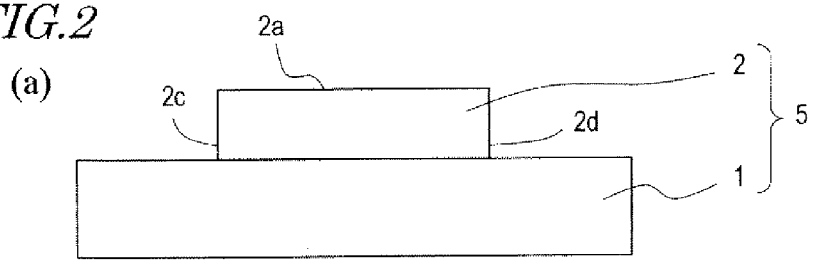
FIG.2 (a)
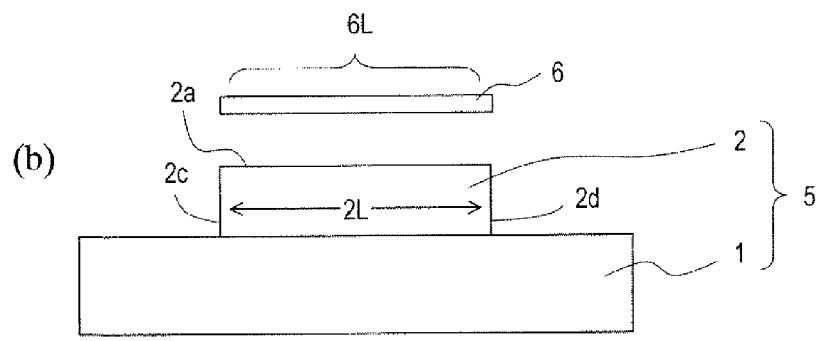
(b)
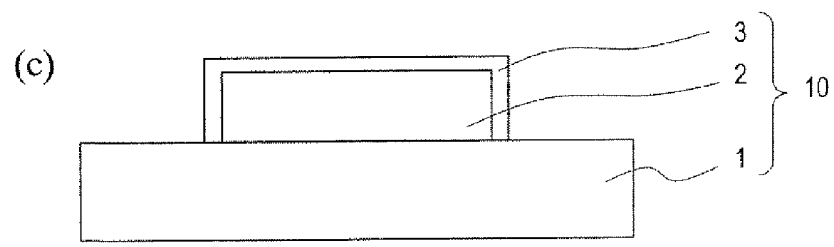
(c)
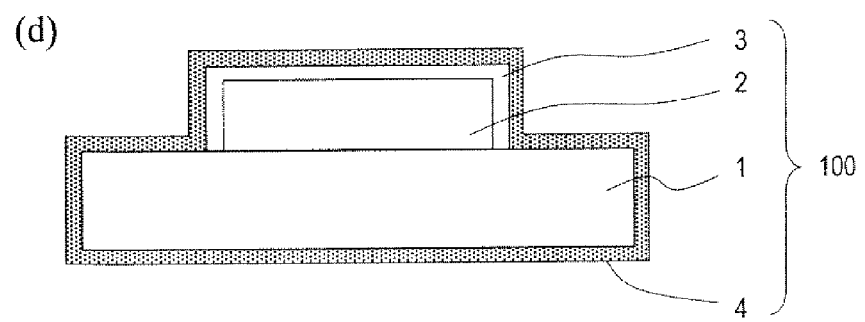
(d)

(a)

(b)

(c)

(d)

US 7,830,001 B2

CU-MO SUBSTRATE AND METHOD FOR PRODUCING SAME

TECHNICAL FIELD

The present invention relates to a Cu—Mo substrate, and more particularly to a Cu—Mo substrate which is suitably used as a heat radiating member for a power module to be mounted in an automobile or the like.

BACKGROUND ART

A power module, which is used for driving a motor or the like, includes a circuit board on which a semiconductor device (chip) (e.g., a power transistor) and a heat spreader (heat sink member) are mounted. Recently, semiconductor devices such as IGBTs (Insulated Gate Bipolar Transistors) which are capable of rapid operation are mainly used.

With reference to FIG. 8, the schematic outline of a generic power module will be described.

A power module 300 is composed of a heat radiating member 101, a circuit board 108 such as a ceramic substrate, and a semiconductor chip 109 such as an IGBT. The circuit board 108 is a Direct Copper Bonding substrate, in which copper-foil circuit boards 108b and 108c are directly bonded onto both faces of a ceramic plate 108a that is composed of alumina, aluminum nitride, silicon nitride or the like. A solder layer 112 such as Sn—Pb is used for bonding between the heat radiating member 101 and the circuit board 108. A solder layer 111 such as Ag—Cu is used for bonding between the circuit board 108 and the semiconductor chip 109.

In recent years, as circuits become more and more highly-integrated and as semiconductor devices improve in operating speed, the power consumption of semiconductor chips is greatly increasing, and the amount of heat generated by chips is also rapidly increasing. Heat generation of a chip not only detracts from the operating speed and lifespan of a device, but also causes considerable problems of chip peeling and breaking.

In order to solve this problem, a material used for a heat spreader is required to have a high thermal conductivity as well as a coefficient of thermal expansion which is substantially equal to the coefficient of thermal expansion of the semiconductor chip. The reason is that, if there is a large difference between the coefficient of thermal expansion of the material of the heat spreader and the coefficient of thermal expansion of the semiconductor chip, the semiconductor chip may peel from the heat spreader or break, no matter how good a thermal conductivity the material may have.

Conventionally, as heat spreaders, composite materials each composed of different kinds of metals are generally used, e.g., Cu—Mo substrates and Cu—W substrates. Such substrates are composed of Cu having a high thermal conductivity and Mo or W, whose coefficient of thermal expansion only has a small difference from that of a semiconductor device of Si or the like, and therefore they exhibit practically satisfactory values in terms of both thermal conductivity and coefficient of thermal expansion. In particular, Cu—Mo substrates are generally used because Mo is less expensive than W. As Cu—Mo substrates, for example, Cu—Mo clad composites, in each of which a Cu base and an Mo base are bonded via rolling or the like, are generally used.

As mentioned above, a heat spreader is bonded to a circuit board or a semiconductor device via brazing. Since Cu and Mo differ in wettability and the like with respect to the brazing material, the surface of a Cu—Mo substrate is usually covered with an Ni plating layer, with the purpose of facilitating brazing and enhancing anticorrosiveness.

However, Cu and Mo are quite different in their abilities to allow an Ni plating layer to be formed thereon. Therefore, within one plating bath, it is difficult to form Ni plating layers showing excellent adhesion both on the surface of the Cu base and on the surface of the Mo base at the same time. As is well-known, Cu permits an Ni plating layer to be easily formed thereon, whereas Mo is liable to oxidization and therefore a hard and brittle oxide film may occur on its surface, thus making it difficult to form an Ni plating layer.

For example, Patent Document 1 discloses a technique for suppressing defects and failures such as gaps and fissures at a bonding site between a heat spreader and a metal part. There, when bonding a heat spreader of a Cu—Mo composite alloy with an Mo metal part, the respective entire surfaces are subjected to separate Ni plating treatments to provide an improved wettability with the brazing material. However, this method requires separate Ni plating treatments to be performed which are suited to the respective materials, thus resulting in inferior productivity.

Alternatively, a method is generally used in which, for a Cu—Mo substrate, a pretreatment step is performed which involves etching the surface of the Mo substrate with red prussiate (potassium ferricyanide) before an Ni plating layer is formed by electroplating technique, and performing a diffusion heat treatment after depositing a thin Au film or a thin Ni film. However, according to this method, as will be described in connection with the Examples set forth below, a good Ni plating layer will be formed on the Mo substrate, but the Cu surface will become coarse and have bulges and the like through etching, thus causing the Ni plating layer to peel. Moreover, according to this method, many processes must be performed prior to Ni plating, thus resulting in a lower productivity.

On the other hand, Patent Document 2 describes a method in which an Ni plating layer is directly formed on the surface of a Cu—Mo substrate by using an electroless plating technique. As compared to electroplating, electroless plating has advantages of permitting uniform plating of a workpiece that has a complicated shape, and providing a coating of Ni plating which is high in hardness and excellent in abrasion resistance.

[Patent Document 1] Japanese Laid-Open Patent Publication No. 6-344131 (Sumitomo Electric Industries, Ltd.)

[Patent Document 2] Japanese Laid-Open Patent Publication No. 62-183132 (Fuji Electric Co., Ltd.)

DISCLOSURE OF INVENTION

Problems to be Solved by the Invention

However, as will be described in connection with the Examples set forth below, with the method described in Patent Document 2, it is difficult to form an Ni plating layer with good adhesion in an exposed portion of the surface of the Mo base (i.e., a region of the surface of the Mo base which is not in contact with the Cu base; hereinafter may be referred to as "exposed surface region of the Mo base").

The present invention has been made in view of the above, and a main objective thereof is to provide: a Cu—Mo substrate which is suitable for use as a heat spreader of a power module, such that an Ni plating layer with excellent adhesion can be formed on both the surface of a Cu base and the surface of an Mo base at the same time by performing an Ni plating for the Cu—Mo substrate in a single plating bath; and a production method thereof. Another objective of the present invention is to provide a power module having a heat spreader which is formed from such a Cu—Mo substrate.

Means for Solving the Problems

A Cu—Mo substrate according to the present invention comprises: a Cu base containing Cu as a main component; an Mo base having opposing first and second principal faces and containing Mo as a main component, the second principal face of the Mo base being positioned on a principal face of the Cu base; and a first Sn—Cu-type alloy layer covering the first principal face and side faces of the Mo base, the first Sn—Cu-type alloy layer containing no less than 1 mass % and no more than 13 mass % of Sn.

A preferred embodiment further comprises a second Sn—Cu-type alloy layer provided between the principal face of the Cu base and the second principal face of the Mo base, the second Sn—Cu-type alloy layer containing no less than 1 mass % and no more than 13 mass % of Sn.

A preferred embodiment further comprises an Ni plating layer covering at least a portion of a surface of the Cu base and the first Sn—Cu alloy layer covering the Mo base.

In a preferred embodiment, the first Sn—Cu-type alloy layer has a first surface which is in contact with the first principal face of the Mo base and a second surface opposite from the first surface, and an Sn concentration at the second surface is higher than an Sn concentration at the first surface.

A power module according to the present invention is a power module comprising a semiconductor device and a heat spreader functioning to transmit a heat of the semiconductor device to the exterior, wherein, the heat spreader comprises the aforementioned Cu—Mo substrate.

In a preferred embodiment, the semiconductor device is an IGBT.

A production method for a Cu—Mo substrate according to the present invention is a method for producing the aforementioned Cu—Mo substrate, comprising: step (a) of providing the Cu base, the Mo base, and an Sn—Cu-type alloy layer containing no less than 1 mass % and no more than 13 mass % of Sn; and step (b) of melting the Sn—Cu-type alloy layer while the Mo base and the Sn—Cu-type alloy layer are present in this order on the principal face of the Cu base.

In a preferred embodiment, step (a) comprises step (a1) of providing a clad composite in which the Cu base and the Mo base are bonded together.

In a preferred embodiment, step (a) comprises step (a2) of providing a clad composite in which an Sn—Cu-type alloy layer containing no less than 1 mass % and no more than 13 mass % of Sn is bonded on the first principal face of the Mo base, and a further Sn—Cu-type alloy layer containing no less than 1 mass % and no more than 13 mass % of Sn is bonded under the second principal face; and step (b) comprises step (b1) of melting the Sn—Cu-type alloy layer and the further Sn—Cu-type alloy layer.

In a preferred embodiment, step (a) comprises step (a3) of further providing a further Sn—Cu-type alloy layer containing no less than 1 mass % and no more than 13 mass % of Sn; and step (b) comprises step (b2) of melting the Sn—Cu-type alloy layer and the further Sn—Cu-type alloy layer while the further Sn—Cu-type alloy layer, the Mo base, and the Sn—Cu-type alloy layer are present on the principal face of the Cu base in this order.

A production method for a Cu—Mo substrate according to the present invention is a method of producing the aforementioned Cu—Mo substrate, comprising: step (a) of providing the Cu base, the Mo base, and an Sn—Cu-type alloy layer containing no less than 1 mass % and no more than 13 mass % of Sn; step (b) of melting the Sn—Cu-type alloy layer while the Sn—Cu-type alloy layer is present on the first principal face of the Mo base, thus forming an Sn—Cu-type alloy layer which covers the first principal face and side faces of the Mo base; and step (c) of bonding the second principal face of the Mo base having the Sn—Cu-type alloy layer formed thereon to the principal face of the Cu base.

Effects of the Invention

In a Cu—Mo substrate according to the present invention, the surface of an Mo base is covered with an Sn—Cu-type alloy layer whose composition is close to that of Cu and which is excellent in adhesion with an Ni plating layer. Therefore, the Cu—Mo substrate can be directly subjected to an Ni plating treatment, without having to perform separate Ni plating treatments, whereby an Ni plating layer which is excellent in adhesion can be formed. Furthermore, the Cu—Mo substrate according to the present invention has a high thermal conductivity, as well as a coefficient of thermal expansion which is substantially equal to the coefficient of thermal expansion of semiconductor chips. Therefore, the Cu—Mo substrate according to the present invention is suitably used as a heat spreader functioning to transmit the heat of a semiconductor device to the exterior, and is particularly useful as a heat spreader for a power module. A power module having the Cu—Mo substrate according to the present invention has excellent heat-releasing characteristics, and is able to avoid peeling and breaking of a semiconductor chip due to a difference in coefficients of thermal expansion.

BRIEF DESCRIPTION OF DRAWINGS

FIG. 1 A cross-sectional view schematically showing the construction of a Cu—Mo substrate 10 according to a first embodiment of the present invention.

FIG. 2 (a) to (d) are step-by-step cross-sectional view schematically showing a first method according to the first embodiment.

Figure 3:
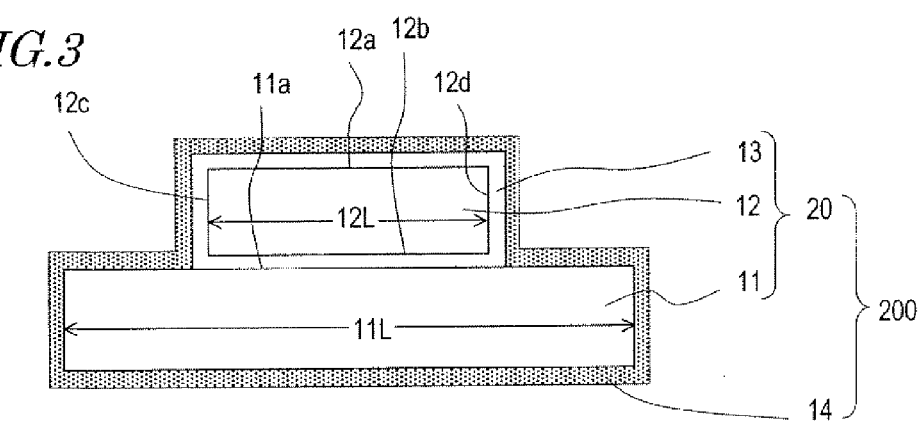
FIG. 3 A cross-sectional view schematically showing the construction of a Cu—Mo substrate 20 according to a second embodiment of the present invention.

| DESCRIPTION OF THE REFERENCE NUMERALS | |
|---|---|
| 1, 11 | Cu base |
| 1a, 11a | principal face of Cu base |
| 2, 12 | Mo base |
| 2a, 12a | first principal face of Mo base |
| 2b, 12b | second principal face of Mo base |
| 2c, 2d, 12c, 12d | side face of Mo base |
| 3 | first Sn—Cu-type alloy layer |

-continued

| | |
|---|---|
| 4, 14 | Ni plating layer |
| 5 | clad composite of Cu base and Mo base bonded together |
| 6 | Sn—Cu-type brazing alloy material |
| 13 | Sn—Cu-type alloy layer |
| 13a | first Sn—Cu-type alloy layer |
| 13b | second Sn—Cu-type alloy layer |
| 15 | clad composite having Sn—Cu-type alloy layers bonded onto both faces of Mo base |
| 10, 20 | Cu—Mo substrate |
| 21 | Cu base |
| 22a, 22b | Mo base |
| 23a, 23b | Sn—Cu-type alloy layer |
| 24 | Ni plating layer |
| 30 | first Cu—Mo substrate 30 |
| 31a | Cu base |
| 32a | Mo base |
| 33a, 33b | Sn—Cu-type alloy layer |
| 34a | Ni plating layer |
| 40a, 40b, 40c, 40d | second CuMo substrate |
| 50a, 50b | ceramic substrate |
| 51, 52 | solder layer such as Sn—Pb |
| 53a, 53b | solder layer such as Ag—Cu |
| 60a, 60b, 60c, 60d | semiconductor chip |
| 70a, 70b | Al wire |
| 80, 300 | power module |
| 90, 120 | Cu—Mo multilayer plate |
| 91, 121 | Cu base |
| 91a, 121a | principal face of Cu base |
| 92, 122 | Mo base |
| 92a, 122a | first principal face of Mo base |
| 92b, 122b | second principal face of Mo base |
| 92c, 92d | side face of Mo base |
| 93, 123 | Sn—Cu-type alloy layer |
| 100, 200 | Cu—Mo—Ni substrate |
| 101 | heat radiating member |
| 108 | circuit board (ceramic substrate) |
| 108a | ceramic plate |
| 108b, 108c | copper foil circuit board |
| 109 | semiconductor chip |
| 111, 112 | solder layer |

BEST MODE FOR CARRYING OUT THE INVENTION

With respect to a Cu—Mo substrate that is composed of a Cu base and an Mo base (which are quite different in their abilities to allow an Ni plating layer to be formed thereon), in order to provide a Cu—Mo substrate such that an Ni plating layer which is excellent in adhesion can be formed at the same time, the inventors have conducted various studies by paying particular attention to brazing materials which are capable of bonding to the Cu base and the Mo base. As a result, the inventors have found that the aforementioned objective is attained by using an Sn—Cu-type brazing alloy material which contains a predetermined amount of Sn and providing an Sn—Cu-type alloy layer which at least covers an exposed surface region of the Mo base, thus arriving at the present invention.

Hereinafter, it will be described as to how the present invention has been arrived at.

An Sn—Cu-type brazing alloy material to be used in the present invention, which is identical to the brazing material described in International Publication WO2006/16479A1 by the present inventors, contains no less than 1 mass % and no more than 13 mass % of Sn. The above International Publication discloses a Cu—Mo substrate having an Sn—Cu-type alloy layer formed on a bonding surface thereof, which is obtained by placing the aforementioned Sn—Cu-type brazing alloy material in between a Cu base and an Mo base (bonding surface) and allowing it to be heat-melted (hereinafter also referred to as a Cu—Mo substrate of the prior invention). According to the prior invention, a Cu—Mo substrate is obtained which has a small difference in coefficient of thermal expansion from the semiconductor device and which has a high thermal conductivity.

Later on, the inventors have found that the aforementioned Sn—Cu-type brazing alloy material has a very excellent wettability with the Cu base and the Mo base, and also has an excellent adhesion with the Ni plating layer. Thus, the inventors have found that using such a brazing material and forming an Sn—Cu-type alloy layer which at least covers an exposed surface region of the Mo base makes it possible to apply the same Ni plating treatment for the Cu base also for the Cu—Mo substrate, thus arriving at the present invention.

The Cu—Mo substrate according to the present invention includes an Sn—Cu-type alloy layer which at least covers an exposed surface region of the Mo base (i.e., an upper face and side faces of Mo), and thus differs in construction from the Cu—Mo substrate of the prior invention whose Sn—Cu-type alloy layer is formed only at the bonding surface between the Cu base and the Mo base. According to the present invention, the exposed surface region of the Mo base (on which it has been difficult to form an Ni plating layer) is covered with a predetermined Sn—Cu-type alloy layer, thus providing an enhanced adhesion with the Ni plating layer. Moreover, since this Sn—Cu-type alloy layer contains Sn in the range of no less than 1 mass % and no more than 13 mass %, as does the Sn—Cu-type alloy layer of the prior invention, the Cu—Mo substrate according to the present invention also has the property of the Cu—Mo substrate of the prior invention (i.e., excellent thermal conductivity and a coefficient of thermal expansion close to the coefficient of thermal expansion of semiconductor devices). Therefore, the Cu—Mo substrate according to the present invention is particularly useful as a heat spreader for a power module.

(Cu—Mo Substrate)

Cu—Mo substrates according to embodiments of the present invention, as well as production methods thereof, will be described.

Hereinafter, before specifically describing each embodiment with reference to the figures, a schematic outline of the present embodiments will be first described.

As mentioned above, the Cu—Mo substrate of the present embodiments is characterized in having a predetermined Sn—Cu-type alloy layer which at least covers an exposed surface region of the Mo base (i.e., a portion which is not bonded to the Cu base).

Typical examples of the Cu—Mo substrate are, for example: a substrate having a first Sn—Cu-type alloy layer provided on an upper face and side faces of an Mo base, as shown in FIG. 1 described below; and a substrate having a second Sn—Cu-type alloy layer further provided between an Mo base and a Cu base (bonding surface), as shown in FIG. 3 described below.

A preferable production method for the Cu—Mo substrate according to the present embodiments includes: step (a) of providing a Cu base, an Mo base, and an Sn—Cu-type alloy layer containing no less than 1 mass % and no more than 13 mass % of Sn; and step (b) of melting the Sn—Cu-type alloy layer while the Mo base and the Sn—Cu-type alloy layer are present in this order on a principal face (upper face) of the Cu base.

This method involves sequentially placing an Mo base and an Sn—Cu-type alloy layer on the upper face of a Cu base, and melting the Sn—Cu-type alloy layer to form a first Sn—Cu-type alloy layer which covers the surface of the Mo base, and optionally a second Sn—Cu-type alloy layer.

Herein, the "Sn—Cu-type alloy layer" which is placed on the Mo base contains an Sn—Cu-type brazing alloy material to be used for composing the intended first and second Sn—Cu-type alloy layers. There is no particular limitation as to the shape of the Sn—Cu-type brazing alloy material, which may be a brazing material in e.g. powder or foil form, or a molding (e.g., a rolled material) that has been worked into a predetermined shape.

As will be specifically described later, first to third methods set forth below may be specific examples. It is not intended that the production method according to the present embodiments be limited thereto.

A first method involves: providing a clad composite in which a Cu base and an Mo base are bonded together (step (a1)); and placing an Sn—Cu-type alloy layer on this clad composite (or strictly speaking, on the upper face of the Mo base) and melting the Sn—Cu-type alloy layer. According to the first method, a first Sn—Cu-type alloy layer which covers an upper face and side faces of the Mo base is formed (see FIG. 2 described below).

A second method involves: providing a clad composite having Sn—Cu-type alloy layers bonded to both faces of an Mo base (step (a2)); and melting these Sn—Cu-type alloy layers. According to the second method, first and second Sn—Cu-type alloy layers are formed on an upper face and side faces of the Mo base and in between the Mo base and the Cu base (see FIG. 4 described below).

A third method involves: placing Sn—Cu-type alloy layers in between a Cu base and an Mo base as well as on an upper face of the Mo base (step (a3)); and melting them. According to the third method, as in the second method, first and second Sn—Cu-type alloy layers are formed so as to cover all surface of the Mo base (see FIG. 5 described below).

Another preferable production method for the Cu—Mo substrate according to the present embodiments includes: step (a) of providing a Cu base, an Mo base, and an Sn—Cu-type alloy layer; step (b) of, while placing an Sn—Cu-type alloy layer on an upper face of the Mo base, melting the Sn—Cu-type alloy layer so as to form an Sn—Cu-type alloy layer which covers an upper face and side faces of the Mo base; and step (c) of bonding a lower face of the Mo base (on which the Sn—Cu-type alloy layer is formed) to the Cu base.

This method involves melting an Sn—Cu-type alloy layer(s) placed on an upper face or both faces of an Mo base so as to form an Sn—Cu-type alloy layer which covers at least a portion of the surface of the Mo base, and then bonding this Mo base to a Cu base. For example, a specific method may involve placing an Sn—Cu-type alloy layer on an upper face of an Mo base and melting it to form an Sn—Cu-type alloy layer which covers the upper face and side faces of the Mo base, and thereafter placing a further Sn—Cu-type alloy layer between the Mo base and the Cu base and melting it. According to this method, a Cu—Mo substrate is obtained in which first and second Sn—Cu-type alloy layers are formed so as to cover all surface of the Mo base. Alternatively, Sn—Cu-type alloy layers may be placed on both faces of an Mo base, and melted to form Sn—Cu-type alloy layers which cover all surface of the Mo base, which may then be bonded to a Cu base.

Hereinafter, with reference to the figures, the construction and production method of Cu—Mo substrates according to the present embodiments will be specifically described.

Embodiment 1

With reference to FIG. 1, a Cu—Mo substrate 10 according to a first embodiment of the present invention will be described. The surface of the Cu—Mo substrate 10 is covered with an Ni plating layer 4. Hereinafter, for convenience of explanation, a substrate before having any Ni plating layer formed thereon will be referred to as a "Cu—Mo substrate", whereas a substrate having an Ni plating layer that covers a Cu—Mo substrate will be referred to as a "Cu—Mo—Ni substrate".

The Cu—Mo substrate 10 of the present embodiment includes: a Cu base containing Cu as a main component (which may hereinafter be simply referred to as a "Cu base") 1; an Mo base containing Mo as a main component (which may hereinafter be simply referred to as an "Mo base") 2; and a first Sn—Cu-type alloy layer 3.

The Mo base 2 has a first principal face 2a and a second principal face 2b that oppose each other, such that the second principal face 2b of the Mo base 2 is positioned on a principal face 1a of the Cu base 1. Hereinafter, for convenience, the first principal face 2a of the Mo base may be referred to as "an upper face of the Mo base 2", and the second principal face 2b "a lower face of the Mo base 2". Although FIG. 1 illustrates an exemplary Cu—Mo substrate in which the Mo base 2 is locally present on the Cu base 1, this is not a limitation. For example, an Mo base 2 having generally the same length 2L as the length 1L of the Cu base may be placed on the Cu base 1. This similarly applies to the below-described embodiments.

As shown in FIG. 1, the Cu—Mo substrate 10 of the present embodiment is characterized in that a first Sn—Cu-type alloy layer 3 is provided so as to cover an exposed surface region of the Mo base 2 (i.e., a first principal face 2a and side faces 2c and 2d of the Mo base 2).

The first Sn—Cu-type alloy layer 3 contains no less than 1 mass % and no more than 13 mass % of Sn. By controlling the amount of Sn contained in the first Sn—Cu-type alloy layer 3 to be 1 mass % or more, it becomes possible to obtain a Cu—Mo substrate which has excellent thermal conductivity and a coefficient of thermal expansion that is close to the coefficient of thermal expansion of semiconductor devices and which also shows excellent adhesion with the Ni plating layer.

An Sn—Cu-type alloy layer having an Sn content of 1 mass % or more has a good wettability with respect to Ni. An Sn content of 2 mass % or more would be preferable for obtaining a particularly excellent wettability. On the other hand, if the Sn content exceeds 13 mass %, the Sn—Cu-type alloy layer will become brittle, whereby breaking and cracking may become liable to occur. Moreover, if the Sn content exceeds 13 mass %, the Sn in the Sn—Cu-type alloy layer will be eluted into the coating of Ni plating during plating, or the Sn may be oxidized, whereby voids (vacancies) may occur in the coating of Ni plating. If voids occur in the coating of Ni plating, bulging or peeling of the film of Ni plating may occur. In order to effectively prevent voids, it is preferable that the Sn content in the Sn—Cu-type alloy layer 3 is 5 mass % or less.

As mentioned above, by controlling the Sn content in the first Sn—Cu-type alloy layer 3 to be no less than 2 mass % and no more than 5 mass %, the Sn—Cu-type alloy layer will have a particularly good wettability with respect to Ni, whereby the film of Ni plating can have an improved adhesion and the film of Ni plating can have a uniform thickness. Moreover, voids generation due to Sn elution and oxidation can also be prevented.

Figure 7:
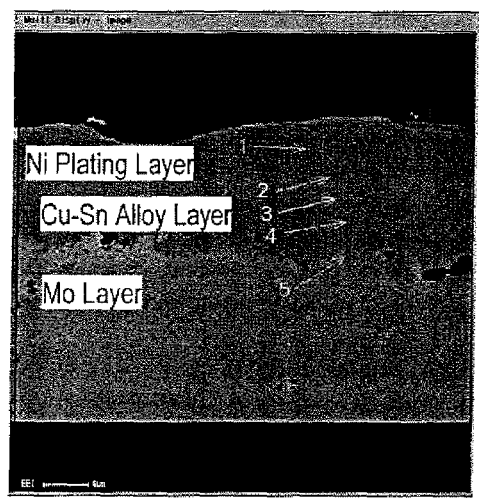
FIG. 7 A photograph showing a cross section of a Cu—Mo—Ni substrate according to Inventive Example 1.
Figure 8:
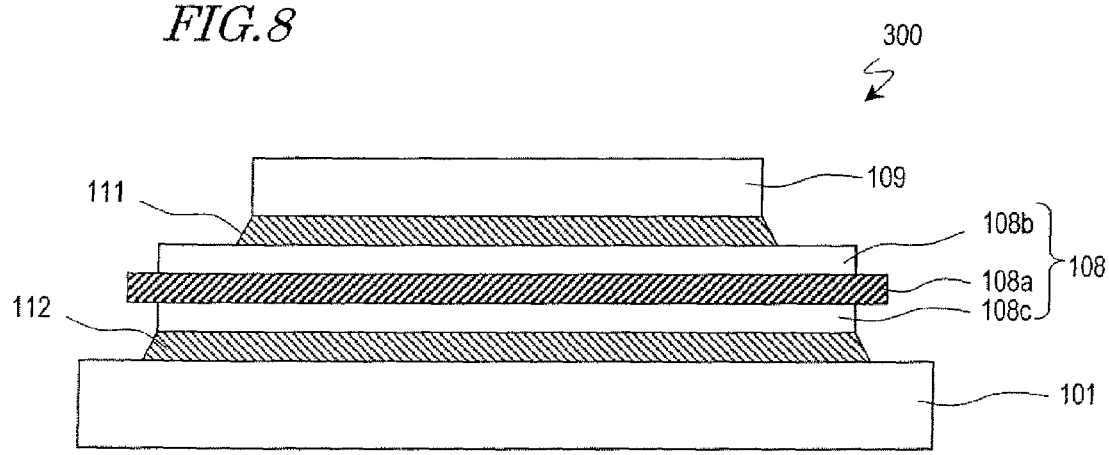
FIG. 8 A cross-sectional view schematically showing a schematic outline of the construction of a generic power module.

Furthermore, the Sn content will also differ along the thickness direction of the Sn—Cu-type alloy layer. For example, with respect to an Sn—Cu-type alloy layer 3A which was formed on the upper face 2a of the Mo base 2, the Sn distribution in a cross section taken along the thickness direction was examined by EPMA (electron probe micro analyzer) analysis, which indicated that, as shown in FIG. 7 described below, Sn existed in a high concentration at the surface (i.e., a face opposite from the face which is in contact with the first principal face 2a of the Mo base 2) of the Sn—Cu-type alloy layer 3A, rather than being uniformly distributed within the alloy layer 3A. The presumable reason why a region of high Sn concentration (concentrated layer) is formed at the surface of the Sn—Cu-type alloy layer is that Sn is susceptible to oxidization, and therefore will migrate toward the surface of the Sn—Cu-type alloy layer during the process of forming the Sn—Cu-type alloy layer. The detailed experimental results will be specifically described in connection with the Examples set forth below. This trend was also observed after forming the Ni plating layer 4 on the Sn—Cu-type alloy layer.

The first Sn—Cu-type alloy layer 3 contains Sn in the aforementioned range, while the remaining parts may be composed of Cu. However, other elements may also be contained within ranges such that the adhesion enhancing action due to the formation of the first Sn—Cu-type alloy layer 3 is not undermined. Examples of other elements include elements (described later) which are contained in the Cu base 1 and will diffuse from the Cu base 1 during the process of forming the first Sn—Cu-type alloy layer 3 (e.g., Pb, Fe, Zn, P). Such other elements may be contained generally in the range of no less than 0.05 mass % and no more than 0.035 mass % in total.

Generally speaking, the thickness of the first Sn—Cu-type alloy layer 3 is preferably 2 µm or more, and more preferably 5 µm or more, whereby the aforementioned action of the Sn—Cu-type alloy layer will be effectively exhibited. Note that the thickness of the first Sn—Cu-type alloy layer 3 has no particular upper limit from the standpoint of obtaining the aforementioned action. However, when taking into consideration cost increases and the like, the upper limit is preferably 100 µm, and more preferably 50 µm, for example. Note that the thickness of the first Sn—Cu-type alloy layer 3 is not necessarily uniform, and may have variations depending on the surface configuration of the Mo base 2, the method for forming the first Sn—Cu-type alloy layer 3, and the like. Herein, it suffices if the layer thickness where the first Sn—Cu-type alloy layer 3 is made thinnest satisfies the aforementioned preferable range. The thickness of the first Sn—Cu-type alloy layer 3 was measured by observing a cross section of the alloy layer with an optical microscope.

The Cu base 1 contains Cu as a main component. By "containing Cu as a main component", it is meant that no less than 99 mass % (and preferably no less than 99.9 mass %) of Cu is contained. The Cu base may be composed only of Cu, or may contain other elements within ranges such that the excellent thermal conductivity associated with Cu is not hindered.

The Mo base 2 contains Mo as a main component. By "containing Mo as a main component", it is meant that no less than 99 mass % (and preferably no less than 99.9 mass %) of Mo is contained. The Mo base may be composed only of Mo, but other elements may be contained within ranges such that Mo's characteristically small difference in coefficient of thermal expansion from those of semiconductor devices is not hindered.

As shown in FIG. 1, the surface of the Cu—Mo substrate 10 is covered with the Ni plating layer 4. Forming the Ni plating layer enhances anticorrosiveness, brazability with the ceramic substrate, and the like.

As has already been described, according to the present embodiment, the exposed surface region of the Mo base 2 (on which it has been difficult to directly form an Ni plating layer) is covered with the first Sn—Cu-type alloy layer 3 having an excellent adhesion with the Ni plating layer. Therefore, the Cu—Mo—Ni substrate 100 can be obtained by performing a single plating process for the Cu—Mo substrate 10.

Although the Cu—Mo—Ni substrate 100 shown in FIG. 1 has the Ni plating layer 4 covering all surface of the Cu—Mo substrate 10, there is not limitation so long as the aforementioned action of the Ni plating layer is effectively exhibited. For example, it suffices so long as the first Sn—Cu-type alloy layer 3 and at least a portion of the surface of the Cu base 1 (a portion of the surface of the Cu base 1 where it is not covered with the Mo base 2 or the first Sn—Cu-type alloy layer 3) are covered with the Ni plating layer 4.

Generally speaking, the thickness of the Ni plating layer 4 is preferably no less than 2 µm and no more than 20 µm, and more preferably no less than 3 µm and no more than 10 µm. If the thickness of the Ni plating layer 4 is below this range, the aforementioned action will not be effectively exhibited. On the other hand, if the thickness of the Ni plating layer 4 exceeds the aforementioned range, the flatness of the Ni plating layer will be lowered, so that properties such as durability will deteriorate.

Next, with reference to FIG. 2, a preferable production method for the Cu—Mo substrate 10 according to the present embodiment will be described. This method corresponds to the aforementioned first method.

(First Method)

First, as shown in FIG. 2(a), a Cu—Mo clad composite 5 in which a Cu base 1 and an Mo base 2 are bonded together is provided (step (a1)).

The Cu—Mo clad composite 5 can be produced by a known method. For example, after the Cu base 1 and the Mo base 2 are stacked together and subjected to hot rolling or cold rolling, it is cut into a desired size according to the product dimensions. As for a production method of the Cu—Mo clad composite 5, a method described in Japanese Laid-Open Patent Publication No. 6-268115 may be referred to, for example.

Next, as shown in FIG. 2(b), an Sn—Cu-type brazing alloy material 6 is placed on the first principal face 2a of the Mo base 2, and is melted by being heated to a predetermined temperature (step (b)). As a result, a first Sn—Cu-type alloy layer 3 is formed which covers the exposed surface region of the Mo base 2 (i.e., the first principal face 2a and side faces 2c and 2d) (see FIG. 2(c)).

The Sn—Cu-type brazing alloy material 6 contains no less than 1 mass % and no more than 13 mass % of Sn. By using such an Sn—Cu-type brazing alloy material 6, a first Sn—Cu-type alloy layer 3 as desired can be formed. The Sn content in the Sn—Cu-type brazing alloy material 6 is preferably no less than 2 mass % and no more than 5 mass %.

The Sn—Cu-type brazing alloy material 6 used for the present embodiment contains Sn in the aforementioned range, while the remaining parts may be composed of Cu. However, other elements may also be contained within ranges such that the adhesion enhancing action due to the use of the Sn—Cu-type brazing alloy material 6 is not undermined. For example, elements such as Pb, Fe, Zn, P, and the like may be contained in an amount of no less than 0.05 mass % and no more than 0.35 mass % in total.

Heating is performed until the Sn—Cu-type brazing alloy material 6 is melted and a first Sn—Cu-type alloy layer 3 is formed which covers not only the first principal face 2a of the Mo base 2 but also the side faces 2c and 2d of the Mo base 2. In this respect, the heating condition in the present embodiment differs from the heating condition described in the aforementioned International Publication. The heating condition in the present embodiment is set to be slightly higher than the lower limit value of the heating temperature described in the aforementioned International Publication (i.e., the melting point of the Sn—Cu-type brazing alloy material 6). The reason is that, if the Sn—Cu-type brazing alloy material 6 is heated only to a temperature which is defined by the lower limit value described in the aforementioned International Publication, an Sn—Cu alloy layer may be formed at the bonding surface between the Cu base 1 and the Mo base 2, but it will be difficult to form a first Cu—Sn-type alloy layer 3 which covers the entire exposed surface region of the Mo base 2.

The specific heating condition may depend on the type, shape, etc. of the Sn—Cu-type brazing alloy material 6 used, but the heating is preferably performed in a range of no less than about 20° C. and no more than about 50° C., and more preferably no less than about 40° C. and no more than about 50° C., above the melting point (about 810° C. to about 1000° C.) of the Sn—Cu-type brazing alloy material 6. However, the upper limit of the heating temperature is a temperature less than the melting point (about 1083° C.) of the Cu base 1. If the heating were performed at a temperature exceeding the melting point of the Cu base 1, the Cu base 1 would be melted.

There is no particular limitation as to the shape of the Sn—Cu-type brazing alloy material 6 used in the present embodiment. Any molding which has been worked into a predetermined shape, or a brazing material in powder or foil form, etc. may be possible.

FIG. 2(*b*) illustrates an exemplary molding which has been worked into a predetermined shape as the Sn—Cu-type brazing alloy material 6. Such a molding can be obtained by, for example, subjecting an Sn—Cu-type alloy of the aforementioned composition to hot rolling at a temperature of about 650° C. to about 750° C., followed by molding.

In the case of using a molding of an Sn—Cu-type brazing alloy material, after this brazing material and the Mo base 2 are stacked together, for example, the Sn—Cu-type brazing alloy material is preferably melted at the aforementioned temperature in a hydrogen atmosphere, while the brazing material and the Mo base 2 are pressed at a pressure of about $10^3$ Pa to about $10^5$ Pa. Thus, the first Sn—Cu-type alloy layers 3 as desired can be formed.

Herein, the size (length 6L) of the Sn—Cu-type brazing alloy material 6 may be substantially the same as the size (2L) of the Mo base 2 as shown in FIG. 2(*b*), but this is not a limitation. For example, the size (length 6L) of the Sn—Cu-type brazing alloy material 6 may be smaller than the size of the Mo base 2. As mentioned earlier, the Sn—Cu-type brazing alloy material 6 has a very excellent wettability with respect to the Mo base 2. Therefore, even if an Sn—Cu-type brazing alloy material 6 which is smaller than the Mo base 2 is placed on the Mo base 2, through a heating at a predetermined temperature, a first Sn—Cu-type alloy 3 which covers the exposed surface region of the Mo base 2 will eventually be formed. Thus, so long as the desired first Sn—Cu-type alloy 3 is formed, the size of the Sn—Cu-type brazing alloy material 6 can be selected as appropriate.

Specifically, an Sn—Cu-type brazing alloy material in powder or foil form is placed on the upper face of the Mo base (preplaced brazing), and is heated to the aforementioned temperature, thus melting the brazing material. The Sn—Cu-type brazing alloy material having been melted through the heating will spread along the upper face and side faces of the Mo base, whereby a desired first Sn—Cu-type alloy layer is formed.

Next, the Cu—Mo substrate 10 thus obtained is covered with an Ni plating layer 4, thus obtaining the Cu—Mo—Ni substrate 100 (see FIG. 2(*d*)).

There is no particular limitation as to the method for forming the Ni plating layer, and any known electroplating technique or electroless plating technique may be adopted.

As compared to the electroplating technique, the electroless plating technique has the advantage of being able to form a uniform Ni plating layer, regardless of the type and shape of the material to be plated (i.e., the Cu—Mo substrate in the present embodiment). In the case of using the electroless plating technique, it is preferable to form the Ni plating layer in the following manner, for example.

First, in order to remove the grease, fingerprints, etc. attached on the surface of the Cu—Mo substrate, degreasing is performed with ethanol or the like. Through degreasing, the wettability during etching is also improved.

Next, the surface is etched by using an etchant such as sulfuric acid-hydrogen peroxide.

Then, a catalytic metal (e.g., Sn, Pd—Sn complex, or Pd) is allowed to be adsorbed to the surface. The electroless plating progresses from this catalytic metal as a core.

Next, an Ni plating layer is formed with an electroless Ni plating solution. Specifically, the Cu—Mo substrate is immersed in a known electroless Ni plating solution (which contains e.g. sodium hypophosphite as a reducing agent in addition to Ni ions) until a predetermined Ni plating layer is obtained. According to the electroless plating technique, the Ni ions in the plating solution are reduced as the reducing agent in the plating solution is oxidized at the surface of the catalytic metal that has been adsorbed to the surface of the Cu—Mo substrate, whereby an Ni plating layer is formed.

Embodiment 2

With reference to FIG. 3, a Cu—Mo substrate 20 according to a second embodiment of the present invention will be described.

The Cu—Mo substrate 20 of the present embodiment includes a Cu base 11, an Mo base 12, and an Sn—Cu-type alloy layer 13. The Mo base 12 has a first principal face 12*a* and a second principal face 12*b* that oppose each other, such that the second principal face 12*b* of the Mo base 12 is positioned on a principal face 11*a* of the Cu base 11.

The Sn—Cu-type alloy layer 13 includes a first Sn—Cu-type alloy layer (not shown) which is formed in the exposed surface region of the Mo base 12 (i.e., the first principal face 12*a* and the side faces 12*c* and 12*d* of the Mo base 12) and a second Sn—Cu-type alloy layer (not shown) which is formed between the second principal face 12*b* of the Mo base 12 and the principal face 11*a* of the Cu base 11. The Sn—Cu-type alloy layer 13 contains no less than 1 mass % and no more than 13 mass % of Sn.

Thus, the Cu—Mo substrate 20 of the present embodiment differs from the Cu—Mo substrate 10 of Embodiment 1 in that the Sn—Cu-type alloy layer 13 is provided not only in the exposed surface region of the Mo base 12 but also at the bonding surface between the Mo base 12 and the Cu base 11. According to the present embodiment, a Cu—Mo substrate is obtained which not only has an excellent adhesion with respect to the Ni plating layer but also shows an enhanced adhesion between the Cu base and the Mo base. Except for this difference, the Cu—Mo substrate 20 of the present embodiment is identical to the Cu—Mo substrate 10 of Embodiment 1, and detailed descriptions thereof are omitted.

Furthermore, a similar trend to Embodiment 1 was observed for the Sn distribution contained in the Sn—Cu-type alloy layer 13A formed on the upper face 12*a* of the Mo base 12, and it was confirmed that Sn existed in a high concentration at the surface (i.e., a face opposite from the face which is in contact with the first principal face 12a of the Mo base 12) of the Sn—Cu-type alloy layer 13A. Such a trend was also similarly observed after the Ni plating layer 14 was formed on the Sn—Cu-type alloy layer 13.

Figure 4:
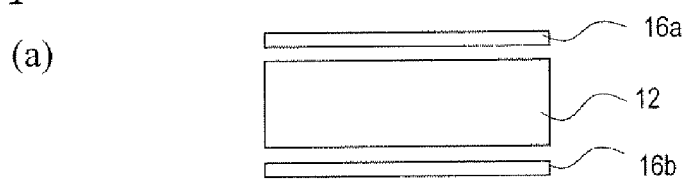
FIG. 4 (a) to (d) are step-by-step cross-sectional views schematically showing a second method according to the second embodiment.
Figure 4:
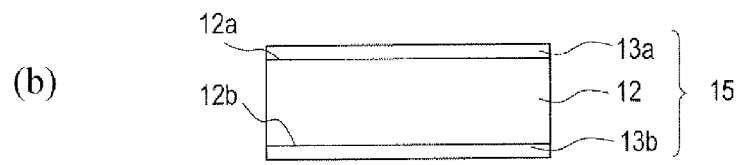
Figure 4:
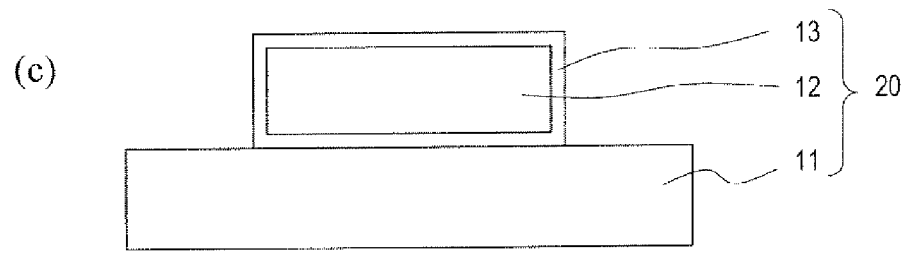
Figure 4:
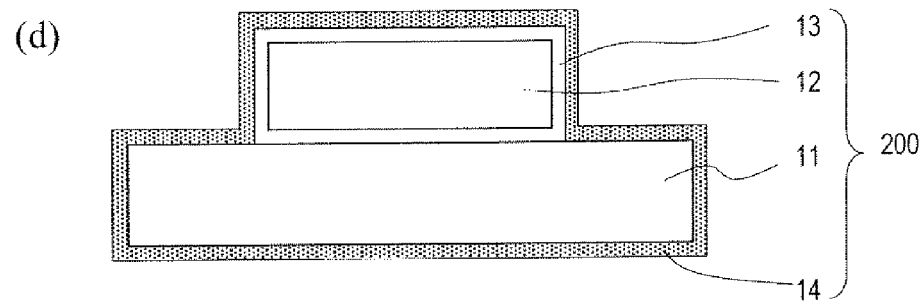
Figure 5:
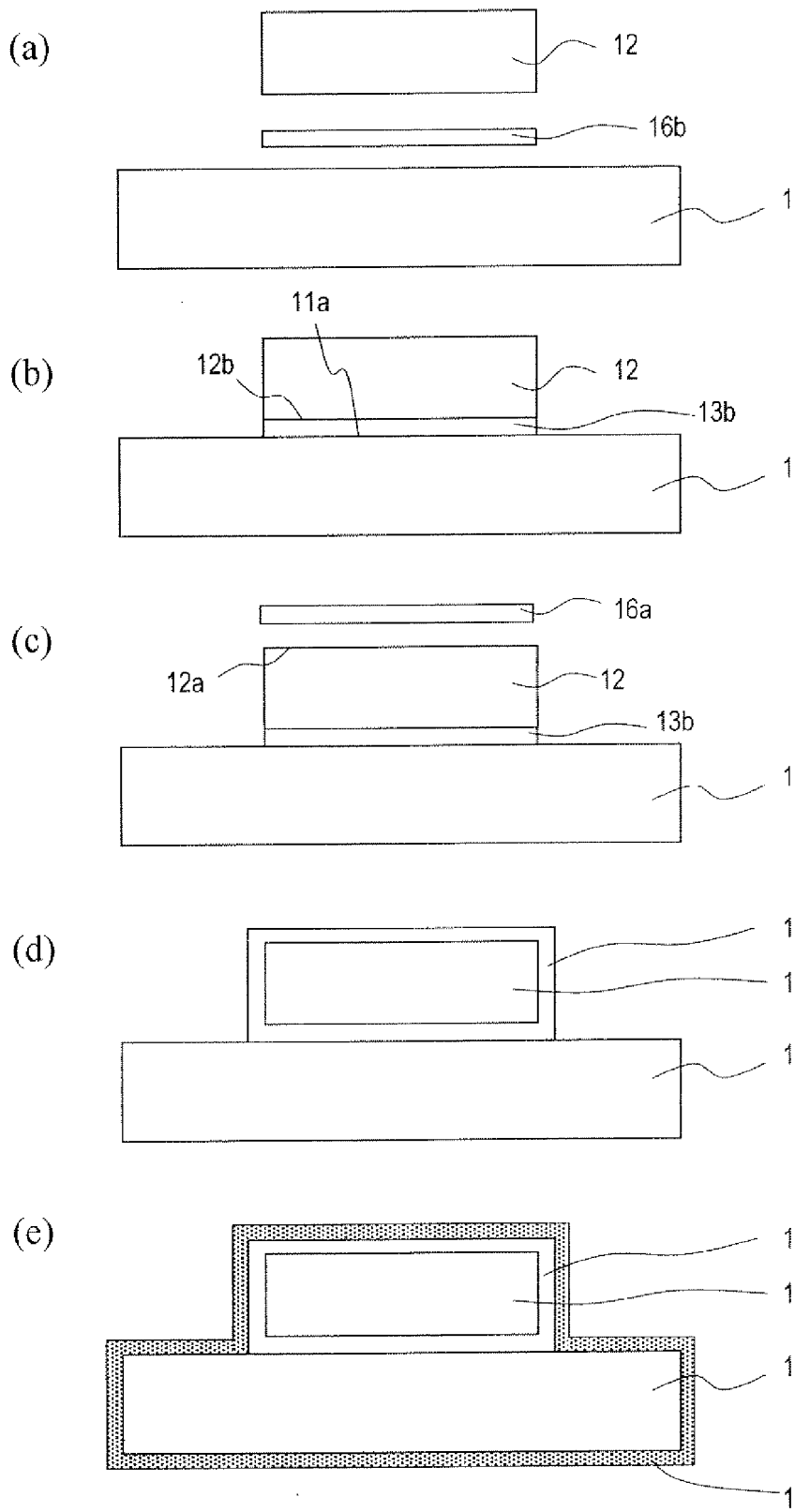
FIG. 5 (a) to (e) are step-by-step cross-sectional views schematically showing a third method according to the second embodiment.

Next, with reference respectively to FIG. 4 and FIG. 5, preferable production methods for the Cu—Mo substrate of the present embodiment will be described. The production steps shown in FIG. 4 and FIG. 5 correspond to the aforementioned second and third methods, respectively.

(Second Method)

The second method will be described with reference to FIG. 4.

First, as shown in FIG. 4(b), a clad composite (multilayer plate) 15 is provided in which Sn—Cu-type alloy layers 13a and 13b containing no less than 1 mass % and no more than 13 mass % of Sn are bonded to first and second principal faces 12a and 12b of an Mo base 12, respectively (step (a2)).

The clad composite 15 can be produced in the following manner, for example.

First, an Sn—Cu-type brazing alloy material 16a, 16b is provided. The details thereof are as specifically described with respect to step (b) of Embodiment 1 above, and the description thereof is omitted.

Next, as shown in FIG. 4(a), the Sn—Cu-type brazing alloy material 16a, the Mo base 12, and the Sn—Cu-type brazing alloy material 16b are stacked together in this order, and after being pressed together at a reduction ratio of about 60%, subjected to a diffusion anneal in a hydrogen atmosphere at a temperature of about 700° C. to 800° C. for about 1 minute to about 3 minutes. As a result, a clad composite 15 in which the Sn—Cu-type alloy layers 13a and 13b are firmly bonded to both faces of the Mo base 12 is obtained.

Next, the clad composite 15 is placed on the principal face of the Cu base 11, and the Sn—Cu-type alloy layers 13a and 13b is heat-melted. The heating is performed until the first and second Sn—Cu-type alloy layers 13a and 13b formed on both faces of the Mo base 12 are melted so that a desired Sn—Cu-type alloy layer 13 is formed which covers all surface of the Mo base 12 (i.e., the principal face 12a and side faces 12c and 12d of the Mo base 12 as well as the bonding surface 12b between the Mo base 12 and the Cu base 11). The detailed heating condition is as described in Embodiment 1 above.

As a result, as shown in FIG. 4(c), a Cu—Mo substrate 20 is obtained in which all surface of the Mo base 12 is covered with the desired Sn—Cu-type alloy layer 13.

Next, in a manner similar to the aforementioned first method, an Ni plating layer 14 is formed on the surface of the Cu—Mo substrate 20, thus obtaining the Cu—Mo—Ni substrate 200 (see FIG. 4(d)).

(Third Method)

The third method will be described with reference to FIG. 5. Hereinafter, steps which are different from the second method will be specifically described, while omitting the description of any overlapping step.

First, as shown in FIG. 5(a), a Cu base 11, an Sn—Cu-type brazing alloy material 16b, and an Mo base 12 are placed in this order, and the Sn—Cu-type brazing alloy material 16b is heated. The heating is performed until the Sn—Cu-type alloy layer 13b is formed between the Cu base 11 and the Mo base 12 (bonding surface) (see FIG. 5(b)). The Sn—Cu-type alloy layer 13b does not need to be formed across the entire bonding surface as shown in FIG. 5(b), but only needs to be formed in at least a portion of the bonding surface. The heating is preferably performed in a similar manner to the aforementioned second method.

Next, as shown in FIG. 5(c), an Sn—Cu-type brazing alloy material 16a is placed on a first principal face 12a of the Mo base 12, and heating is performed. The heating is performed until the Sn—Cu-type brazing alloy material 16a is melted so that all surface of the Mo base 12 (12a, 12b, 12c, 12d) is covered with the Sn—Cu-type alloy layer 13. The heating condition is substantially the same as the condition described in the second method above.

As a result, as shown in FIG. 5(d), a Cu—Mo substrate 20 is obtained in which all surface of the Mo base 12 is covered with the Sn—Cu-type alloy layer 13.

Next, in a manner similar to the first method above, the surface of the Cu—Mo substrate 20 is covered with an Ni plating layer 14, thus obtaining the Cu—Mo—Ni substrate 200 (see FIG. 5(e)).

The production method according to the present embodiment is not limited to the second and third methods described above. For example, in the third method, an Sn—Cu-type brazing alloy material to which a Cu base is bonded (clad composite) may be used instead of the Sn—Cu-type brazing alloy material 16a. As compared to using an Sn—Cu-type brazing alloy material 16a to which a Cu base is not bonded, this method can prevent deformation of the Sn—Cu-type brazing alloy material 16a in the production step for the Cu—Mo substrate. Such an Sn—Cu-type brazing alloy material having a Cu base bonded thereto can be obtained in a similar manner to the second method above, where a clad composite 15 (see FIG. 4(b)) is produced in which Sn—Cu-type alloy layers are bonded to both faces of an Mo base, for example. According to this method, a Cu—Mo—Cu substrate is obtained, in which a Cu substrate is further provided on the upper face of the Sn—Cu-type alloy layer 13.

Embodiment 3

Figure 6:
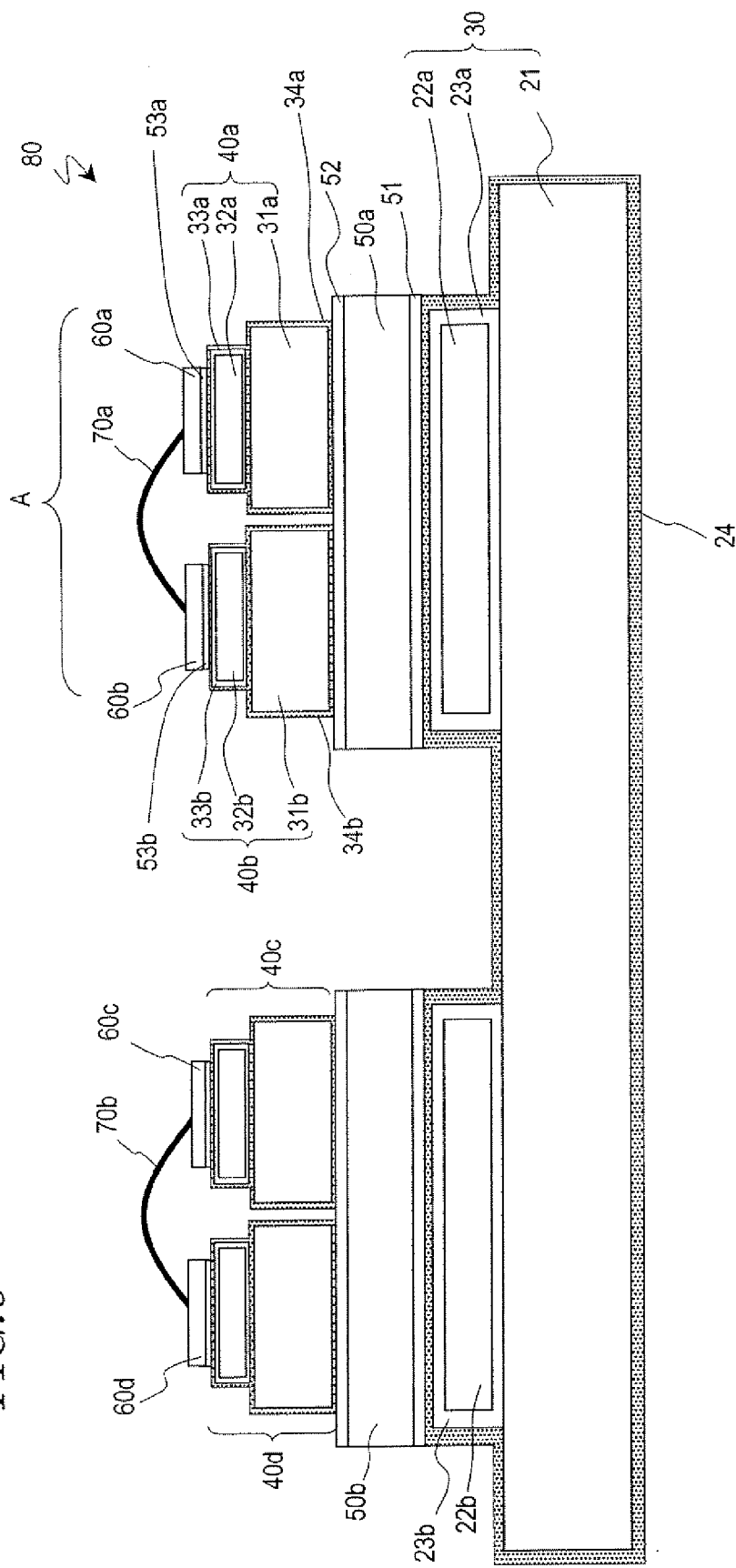
FIG. 6 A cross-sectional view schematically showing the construction of a power module according to a third embodiment of the present invention.

With reference to FIG. 6, an embodiment of a power module 80 having the Cu—Mo—Ni substrate according to the present embodiment will be described. However, the power module of the present embodiment is not limited thereto.

As shown in FIG. 6, in the power module 80, a first Cu—Mo substrate 30, two ceramic substrates 50a and 50b, four second Cu—Mo substrates 40a, 40b, 40c and 40d, and four semiconductor chips (IGBT) 60a, 60b, 60c and 60d are stacked in this order. Electrical connections between the semiconductor chips 60a and 60b, and between 60c and 60d are provided via Al wires 70a and 70b, respectively.

The first Cu—Mo substrate 30 includes: a Cu base 21 having a thickness of about 3 mm; and two Mo bases 22a and 22b which are locally present on the Cu base 21 (each having a thickness of about 0.6 mm). The surfaces of the Mo bases 22a and 22b are covered with Sn—Cu-type alloy layers 23a and 23b, respectively, each having a thickness of about 20 μm, whereby enhanced heat-releasing characteristics and an enhanced adhesion with an Ni plating layer 24 are obtained. The surface of the first Cu—Mo substrate 30 is covered with the Ni plating layer 24 having a thickness of about 5 μm, whereby an enhanced brazability with the ceramic substrates 50a and 50b is obtained.

The second Cu—Mo substrates 40a and 40b, and 40c and 40d are provided on the Mo bases 22a and 22b, respectively, via the ceramic substrates 50a and 50b. Since the second Cu—Mo substrates 40a, 40b, 40c and 40d are all identical in construction, the following description will be directed to the second Cu—Mo substrate 40a.

The second Cu—Mo substrate 40a includes: a Cu base 31a having a thickness of about 2 mm; and an Mo base 32a being locally present on the Cu base 31a and having a thickness of about 0.5 mm. The surface of the Mo base 32a is covered with an Sn—Cu-type alloy layer 33b having a thickness of about 20 μm, whereby enhanced heat-releasing characteristics and an enhanced adhesion with an Ni plating layer 34a are obtained. The surface of the second Cu—Mo substrate 40a is covered with the Ni plating layer 34a having a thickness of about 3 μm, whereby an enhanced brazability with the ceramic substrate 50a and the semiconductor chip 60a is obtained.

Although FIG. 6 illustrates an exemplary Cu—Mo substrate 40a in which all surface of the Mo base 32a is covered with the Sn—Cu-type alloy layer 33a, this is not a limitation. For example, a Cu—Mo substrate may be used in which only the exposed surface region (an upper face and side faces) of the Mo base 32a is covered with the Sn—Cu-type alloy layer 33a.

Solder layers 51 and 52 (e.g., Sn—Pb) are used for bonding between the first Cu—Mo substrate 30 and the ceramic substrate 50a, and between the ceramic substrate 50a and the second Cu—Mo substrates 40a and 40b, respectively. On the other hand, solder layers 53a and 53b (e.g., Ag—Cu) are used for bonding between the second Cu—Mo substrates 40a and 40b and the semiconductor chips 60a and 60b.

Next, a production method for the power module 80 of the present embodiment will be described.

As shown in FIG. 6, the power module 80 of the present embodiment has two equivalent multilayer structures provided on the Cu base 21. Hereinafter, for convenience of explanation, the construction on the right-hand half (A in the figure) of FIG. 6 will be focused.

First, by the first method according to Embodiment 1 above, the first Cu—Mo substrate 30 and the second Cu—Mo substrates 40a and 40b are produced. Next, by electroless plating technique, an Ni plating layer is provided so as to cover each surface. The details of the electroless plating technique will be described in connection with the Examples set forth below.

Then, the first Cu—Mo substrate 30 and the ceramic substrate 50a are bonded together. Specifically, for example, a Cu—Ag-type brazing material is placed between the first Cu—Mo substrate 30 and the ceramic substrate 50a, and heat-melted. The type of brazing material is not limited thereto, and any known brazing material that is capable of bonding together the Cu—Mo substrate 30 and the ceramic substrate 50a may be used. The heating temperature may be determined as appropriate according to the type of brazing material used.

Furthermore, the second Cu—Mo substrates 40a and 40b and the semiconductor chips 60a and 60b are bonded together, respectively. Specifically, for example, pieces of an Ag—Cu-type brazing material are placed between the second Cu—Mo substrates 40a and 40b and the semiconductor chips 60a and 60b, and heat-melted to effect bonding. As for the type of brazing material, any known brazing material that is capable of bonding together the Cu—Mo substrates 40a and 40b and the semiconductor chips 60a and 60b can be used. The heating temperature may be determined as appropriate according to the type of brazing material used.

Next, the ceramic substrate 50a having the first Cu—Mo substrate 30 bonded thereto and the second Cu—Mo substrates 40a and 40b having the semiconductor chips 60a and 60b bonded thereto are bonded together. Specifically, for example, pieces of an Sn—Pb-type brazing material are placed between the ceramic substrate 50a and the second Cu—Mo substrates 40a and 40b, and heat-melted. The type of brazing material is not limited thereto, and any known brazing material that is capable of bonding together the ceramic substrate 50a and the Cu—Mo substrates 40a and 40b may be used. The heating temperature may be determined as appropriate according to the type of brazing material used.

(Cu—Mo Multilayer Plate)

A Cu—Mo multilayer plate according to an embodiment of the present invention includes a Cu base, an Mo base, and an Sn—Cu-type alloy layer containing no less than 1 mass % and no more than 13 mass % of Sn, which are positioned in this order. A further Sn—Cu-type alloy layer containing no less than 1 mass % and no more than 13 mass % of Sn may be provided between the Cu base and the Mo base (bonding surface).

The Cu—Mo multilayer plate according to the present embodiment differs from the above-described Cu—Mo substrate according to the present embodiments in that no Sn—Cu-type alloy layer exists on the side faces of the Mo base. Such a Cu—Mo multilayer plate may be useful as a material for producing a Cu—Mo substrate, for example.

EXAMPLES

With the methods of Experimental Examples 1 to 7 described below, Cu—Mo—Ni substrates were produced each having an Ni plating layer on the surface of a Cu—Mo substrate, and their exterior appearances were compared.

Experimental Example 1

Herein, by using a Cu—Mo clad composite, a Cu—Mo substrate having an Sn—Cu-type alloy layer provided in an exposed surface region (an upper face and side faces) of Mo was produced (Inventive Example 1). The Cu—Mo clad composite was produced by stacking together the Cu base 1 and the Mo base 2 and subjecting them to hot rolling (thickness of the Cu base: 0.63 mm; thickness of the Mo base: 0.63 mm).

Next, an Sn—Cu-type brazing alloy foil (thickness: 25 μm) containing about 2 mass % of Sn was provided. The Sn—Cu-type brazing alloy foil had a melting point of about 950° C.

The Sn—Cu-type brazing alloy foil thus obtained was placed on the upper face of the Cu—Mo clad composite (or strictly speaking, on the Mo base), and heated at a temperature of about 99° C. for about 3 minutes. Through the heating, the Sn—Cu-type brazing alloy foil was melted, and a Cu—Mo substrate was obtained in which the upper face and side faces of the Mo base were covered with an Sn—Cu-type alloy layer having a thickness of about 20 μm. The Sn content in the Sn—Cu-type alloy layer was generally in the range from 1.1 mass % to 2.5 mass %.

Next, following the procedure from (1) to (4) below, an Ni plating layer having a thickness of about 3 μm to 5 μm was formed on the surface of the Cu—Mo substrate.

(1) Degreasing with ethanol (at room temperature for 1 minute)

(2) Etching with sulfuric acid hydrogen peroxide (a solution in which sulfuric acid, hydrogen peroxide, and water was mixed at a volume ratio of 10:5:85) (at 30° C. for 5 minutes)

(3) Introduction of a catalytic metal to the Cu—Mo substrate

Apply an Sn catalyst (at room temperature for about 5 minutes)→Apply a Pd—Sn complex catalyst (at room temperature for about 5 minutes)→Apply a Pd catalyst (at room temperature for about 3 minutes)

(4) Formation of an Ni plating layer

By using an electroless Ni plating bath (sulfuric acid Ni: 30 g/L; sodium hypophosphite: 10 g/L; sodium acetate: appropriate amount; pH: about 4.6) of the below-described composition, plating was performed at 80° C. for 30 minutes.

Experimental Example 2

For comparison, a Cu—Mo substrate was subjected to electroless Ni plating in a manner similar to the method described in Patent Document 1.

Specifically, the same type of Cu—Mo clad composite as that of Experimental Example 1 was provided, and an Ni plating layer was formed by using an electroless Ni plating bath as described in Experimental Example 1.

Experimental Example 3

For reference sake, a Cu—Mo substrate was subjected to a conventional Ni plating treatment.

Specifically, the same type of Cu—Mo clad composite as that of Experimental Example 1 was provided, and an Ni plating layer was formed by the following procedure.

First, the Cu—Mo clad composite was immersed (at room temperature for about 10 seconds) in an etchant containing about 200 g/L to 250 g/L of potassium ferricyanide, thus etching its surface.

Next, on the Cu—Mo clad composite having been thus etched, an Au coating was deposited to a thickness of about 0.1 µm by sputtering technique. The sputtering was performed under a bias voltage of about 1 kV to 5 kV for about 30 minutes, while controlling the pressure within the vacuum container at about $10^{-1}$ Pa.

Next, the Cu—Mo substrate having the Au coating deposited thereon was subjected to a diffusion heat treatment at about 700° C. for 10 minutes in an $H_2$ atmosphere.

Thereafter, an Ni plating layer was formed according to the procedure of (1) to (4) described in Experimental Example 1.

Experimental Example 4

An Ni plating layer was formed through the same procedure as that of Experimental Example 1, except that an Sn—Cu-type brazing alloy foil (melting point: about 940° C.) containing 5 mass % of Sn was used. Note that the heat treatment for forming the Sn—Cu-type alloy layer was performed at a temperature about 4° C. to about 5° C. which was higher than the melting point of the brazing foil used. This also applies to Experimental Examples 5 to 7 below.

Experimental Example 5

An Ni plating layer was formed through the same procedure as that of Experimental Example 1, except that an Sn—Cu-type brazing alloy foil (melting point: about 810° C.) containing 13 mass % of Sn was used.

Experimental Example 6

For comparison, an Ni plating layer was formed through the same procedure as that of Experimental Example 1, except that an Sn—Cu-type brazing alloy foil (melting point: about 800° C.) containing 14 mass % of Sn was used.

Experimental Example 7

For comparison, an Ni plating layer was formed through the same procedure as that of Experimental Example 1, except that an Sn—Cu-type brazing alloy foil (melting point: about 1000° C.) containing 0.5 mass % of Sn was used.

(Evaluations)

The exterior appearance of the Cu—Mo substrates obtained according to Experimental Examples 1 to 7 was observed by visual inspection. Hereinafter, the Cu—Mo substrates obtained according to Experimental Examples 1 to 7 will be referred to as Inventive Example 1, Comparative Example 1, and Conventional Example, Inventive Example 2, Inventive Example 3, Comparative Example 2, and Comparative Example 3, respectively.

In Inventive Examples 1 to 3, the upper face and side faces of the Mo base are covered with a predetermined Sn—Cu-type alloy layer, and therefore no bulging of the substrate or peeling of the Ni plating layer was observed. Moreover, a cross section (about 4 $cm^2$) of each of Inventive Examples 1 and 2 was observed with an optical microscope (magnification×10), whereby no voids were found in the Sn—Cu alloy layer and the Ni plating layer. In Inventive Example 3, five minute voids with a diameter of 30 µm to 80 µm were found in the Sn—Cu alloy layer and the Ni plating layer, which were ascribable to partial oxidation of Sn or elution of a minute amount of Sn during plating, but no bulging or peeling was found.

On the other hand, in Comparative Example 1, the Ni plating layer was not formed with good adhesion, and bulging was observed in a portion of the surface. In Comparative Example 2, the Ni plating layer was formed with good adhesion, but seven bulges with a diameter of 100 µm or more were observed in portions of the surface. In Comparative Example 3, a portion of the base Cu melted during brazing, the Ni plating layer was not formed with good adhesion, and five bulges with a diameter of about 100 µm were observed in the face which was in contact with the Mo base.

On the other hand, in Conventional Example, the Ni plating layer was formed with good adhesion on the surface of the Mo base, but bulging occurred in a portion of the Cu base that was not in contact with the Mo base, and peeling of the Ni plating layer was observed.

(Sn Distribution in the Sn—Cu-Type Alloy Layer)

With respect to Inventive Example 1, the Sn concentration in a cross section, taken along the thickness direction, of the Sn—Cu-type alloy layer formed on the upper face of the MO base was measured by EPMA analysis. Specifically, in a cross-sectional photograph of the Cu—Mo—Ni substrate shown in FIG. 7, the Sn concentration was measured in a total of five points (portions indicated with arrows 1 to 5 in the figure). The results are shown in Table 1.

TABLE 1

| | points of measurement | | |
|---|---|---|---|
| number in FIGURE | depth from Ni plating layer (mm) | notes | Sn amount (mass %) |
| 1 | 0.0025 | generally central portion of Ni plating layer | — |
| 2 | 0.005 | interface between Ni plating layer and alloy layer | 2.47 |
| 3 | 0.010 | within alloy layer | 1.37 |
| 4 | 0.016 | within alloy layer | 1.15 |
| 5 | 0.025 | interface between alloy layer and Mo base | 1.40 |

As shown in Table 1, it was found that Sn in the Sn—Cu-type alloy layer formed on the upper face of the Mo base exists in highest concentration at the interface between the Ni plating layer and the Sn—Cu-type alloy layer, rather than being uniformly distributed throughout the alloy layer. The presumable reason is that, as mentioned earlier, Sn is likely to be oxidized and migrates toward the surface of the Sn—Cu-type alloy layer during the process of forming the Sn—Cu-type alloy layer. However, from the Mo base side toward the Ni plating layer side, the Sn concentration undergoes stepwise increases as shown in Table 1, rather than gradually increasing.

Although an Sn concentration in the Cu—Mo—Ni substrate having the Ni plating layer formed thereon was measured herein, it has been experimentally confirmed that a similar trend is also observed in the Cu—Mo substrate before the Ni plating layer is formed.

INDUSTRIAL APPLICABILITY

The Cu—Mo substrate according to the present invention is suitably used as a heat spreader for a power module to be mounted in an automobile or the like, for example.

The invention claimed is:

1. A Cu—Mo substrate comprising:
   a Cu base containing Cu as a main component;
   an Mo base having opposing first and second principal faces and containing Mo as a main component, the second principal face of the Mo base being positioned on a principal face of the Cu base; and
   a first Sn—Cu-type alloy layer covering the first principal face and side faces of the Mo base, the first Sn—Cu-type alloy layer containing no less than 1 mass % and no more than 13 mass % of Sn.

2. The Cu—Mo substrate of claim 1, further comprising a second Sn—Cu-type alloy layer provided between the principal face of the Cu base and the second principal face of the Mo base, the second Sn—Cu-type alloy layer containing no less than 1 mass % and no more than 13 mass % of Sn.

3. The Cu—Mo substrate of claim 1 or 2, further comprising an Ni plating layer covering at least a portion of a surface of the Cu base and the first Sn—Cu alloy layer covering the Mo base.

4. The Cu—Mo substrate of any of claim 1 or 2, wherein the first Sn—Cu-type alloy layer has a first surface which is in contact with the first principal face of the Mo base and a second surface opposite from the first surface, and an Sn concentration at the second surface is higher than an Sn concentration at the first surface.

5. A power module comprising a semiconductor device and a heat spreader functioning to transmit a heat of the semiconductor device to the exterior, wherein,
   the heat spreader comprises the Cu—Mo substrate of claim 4.

6. The power module of claim 5, wherein the semiconductor device is an IGBT.

7. A method for producing the Cu—Mo substrate of claim 1 or 2, comprising:
   step (a) of providing the Cu base, the Mo base, and an Sn—Cu-type alloy layer containing no less than 1 mass % and no more than 13 mass % of Sn; and
   step (b) of melting the Sn—Cu-type alloy layer while the Mo base and the Sn—Cu-type alloy layer are present in this order on the principal face of the Cu base.

8. The production method for a Cu—Mo substrate of claim 7, wherein step (a) comprises step (a1) of providing a clad composite in which the Cu base and the Mo base are bonded together.

9. The production method for a Cu—Mo substrate of claim 7, wherein,
   step (a) comprises step (a2) of providing a clad composite in which an Sn—Cu-type alloy layer containing no less than 1 mass % and no more than 13 mass % of Sn is bonded on the first principal face of the Mo base, and a further Sn—Cu-type alloy layer containing no less than 1 mass % and no more than 13 mass % of Sn is bonded under the second principal face; and
   step (b) comprises step (b1) of melting the Sn—Cu-type alloy layer and the further Sn—Cu-type alloy layer.

10. The production method for a Cu—Mo substrate of claim 7, wherein,
    step (a) comprises step (a3) of further providing a further Sn—Cu-type alloy layer containing no less than 1 mass % and no more than 13 mass % of Sn; and
    step (b) comprises step (b2) of melting the Sn—Cu-type alloy layer and the further Sn—Cu-type alloy layer while the further Sn—Cu-type alloy layer, the Mo base, and the Sn—Cu-type alloy layer are present on the principal face of the Cu base in this order.

11. A method of producing the Cu—Mo substrate of claim 1 or 2, comprising:
    step (a) of providing the Cu base, the Mo base, and an Sn—Cu-type alloy layer containing no less than 1 mass % and no more than 13 mass % of Sn;
    step (b) of melting the Sn—Cu-type alloy layer while the Sn—Cu-type alloy layer is present on the first principal face of the Mo base, thus forming an Sn—Cu-type alloy layer which covers the first principal face and side faces of the Mo base; and
    step (c) of bonding the second principal face of the Mo base having the Sn—Cu-type alloy layer formed thereon to the principal face of the Cu base.

* * * * *